(12) United States Patent
Jerman

(10) Patent No.: US 7,091,647 B2
(45) Date of Patent: Aug. 15, 2006

(54) MICROMECHANICAL DEVICE HAVING BRAKING MECHANISM

(75) Inventor: John H. Jerman, Palo Alto, CA (US)

(73) Assignee: Coherent, Inc., San Jose, CA (US)

( * ) Notice: Subject to any disclaimer, the term of this patent is extended or adjusted under 35 U.S.C. 154(b) by 0 days.

(21) Appl. No.: 10/209,105

(22) Filed: Jul. 30, 2002

(65) Prior Publication Data
US 2003/0034709 A1   Feb. 20, 2003

Related U.S. Application Data

(60) Provisional application No. 60/309,228, filed on Jul. 31, 2001.

(51) Int. Cl.
   *H02N 1/00*   (2006.01)
   *G02B 26/08*   (2006.01)

(52) U.S. Cl. .................... 310/309; 310/40 MM; 385/18

(58) Field of Classification Search ............ 310/309, 310/77, 40 MM; 188/29, 57, 156–158; 385/16, 385/18, 136

See application file for complete search history.

(56) References Cited

U.S. PATENT DOCUMENTS

| | | | | |
|---|---|---|---|---|
| 3,679,027 A | * | 7/1972 | Jansson | 188/74 |
| 5,998,906 A | * | 12/1999 | Jerman et al. | 310/309 |
| 6,175,170 B1 | * | 1/2001 | Kota et al. | 310/40 MM |
| 6,351,580 B1 | * | 2/2002 | Dhuler et al. | 385/19 |
| 6,360,036 B1 | * | 3/2002 | Couillard | 385/19 |
| 6,452,350 B1 | * | 9/2002 | Finkemeyer et al. | 318/372 |
| 2003/0034709 A1 | * | 2/2003 | Jerman | 310/209 |

* cited by examiner

*Primary Examiner*—Karl Tamai
(74) *Attorney, Agent, or Firm*—Dorsey & Whitney LLP

(57) ABSTRACT

The present invention provides a brakeable microapparatus comprising a substrate and a structure overlying the substrate and movable relative to the substrate. A frictional brake overlies the structure and is movable into frictional engagement with the structure for holding the structure relative to the substrate.

37 Claims, 3 Drawing Sheets

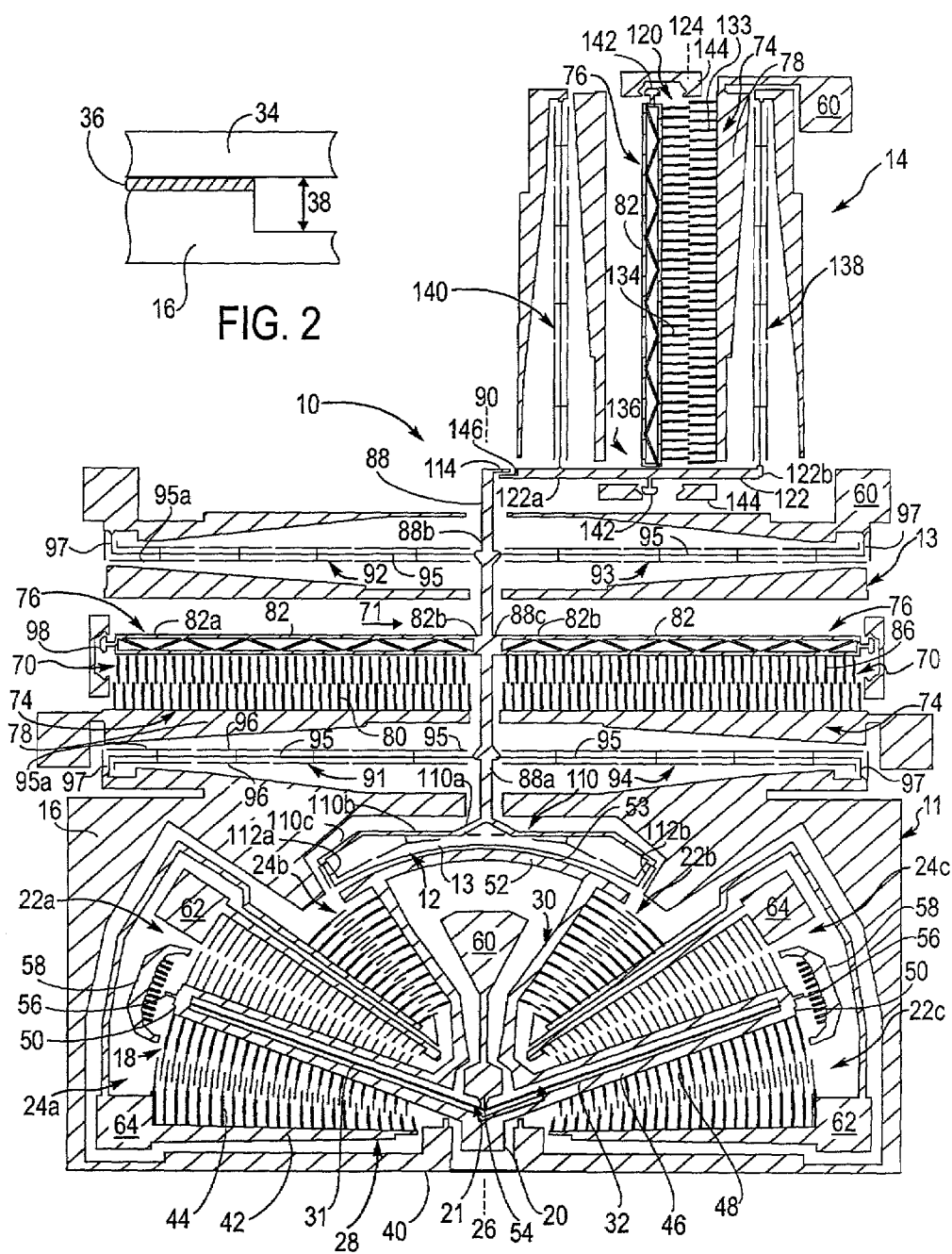

MICROMECHANICAL DEVICE HAVING BRAKING MECHANISM

CROSS-REFERENCE TO RELATED APPLICATION

The application claims priority to U.S. provisional patent application Ser. No. 60/309,228 filed Jul. 31, 2001, the entire content of which is incorporated herein by this reference.

FIELD OF THE INVENTION

The present invention relates generally to micromechanical devices and more particularly to micromechanical devices that can be locked in positions.

BACKGROUND

Micromechanical actuators have been disclosed for moving or adjusting elements such as mirrors for optical systems. In almost all cases it is necessary to continuously apply power to maintain the position of the actuator.

U.S. Pat. No. 5,998,906 to Jerman et al describes a linear actuator with large displacement that can be continuously adjusted over its range. U.S. Pat. No. 5,955,817 to Dhuler et al describes a thermal actuator system including a latch for reducing the power required by the actuator during use. Neither of these patents, however, disclose an actuator that can be moved to an arbitrary position and held in place.

In general, it is an object of the invention to provide a microactuator having a braking mechanism.

Another object of the invention is to provide a microactuator having a braking mechanism that allows moving the microactuator to a given location and holding the actuator in that location.

Another object of the invention is to provide a microactuator having a braking mechanism for holding the microactuator at arbitrary positions along the range of travel of the microactuator.

SUMMARY OF THE INVENTION

The present invention provides a brakeable micromechanical device comprising a substrate and a structure overlying the substrate and movable relative to the substrate. A frictional brake overlies the substrate and is movable into frictional engagement with the structure for holding the structure relative to the substrate.

BRIEF DESCRIPTION OF THE DRAWINGS

The accompanying drawings, which are somewhat schematic in some instances and are incorporated in and form a part of this specification. These drawings illustrate an embodiment of the invention and, together with the description, serve to explain the principles of the invention.

FIG. 1 is a top plan view of the micromechanical device having a brake mechanism of the present invention that is disengaged.

FIG. 2 is a cross-sectional view of the micromechanical device of FIG. 1 taken along the line 2—2 of FIG. 1.

DESCRIPTION OF THE INVENTION

Figure 3:
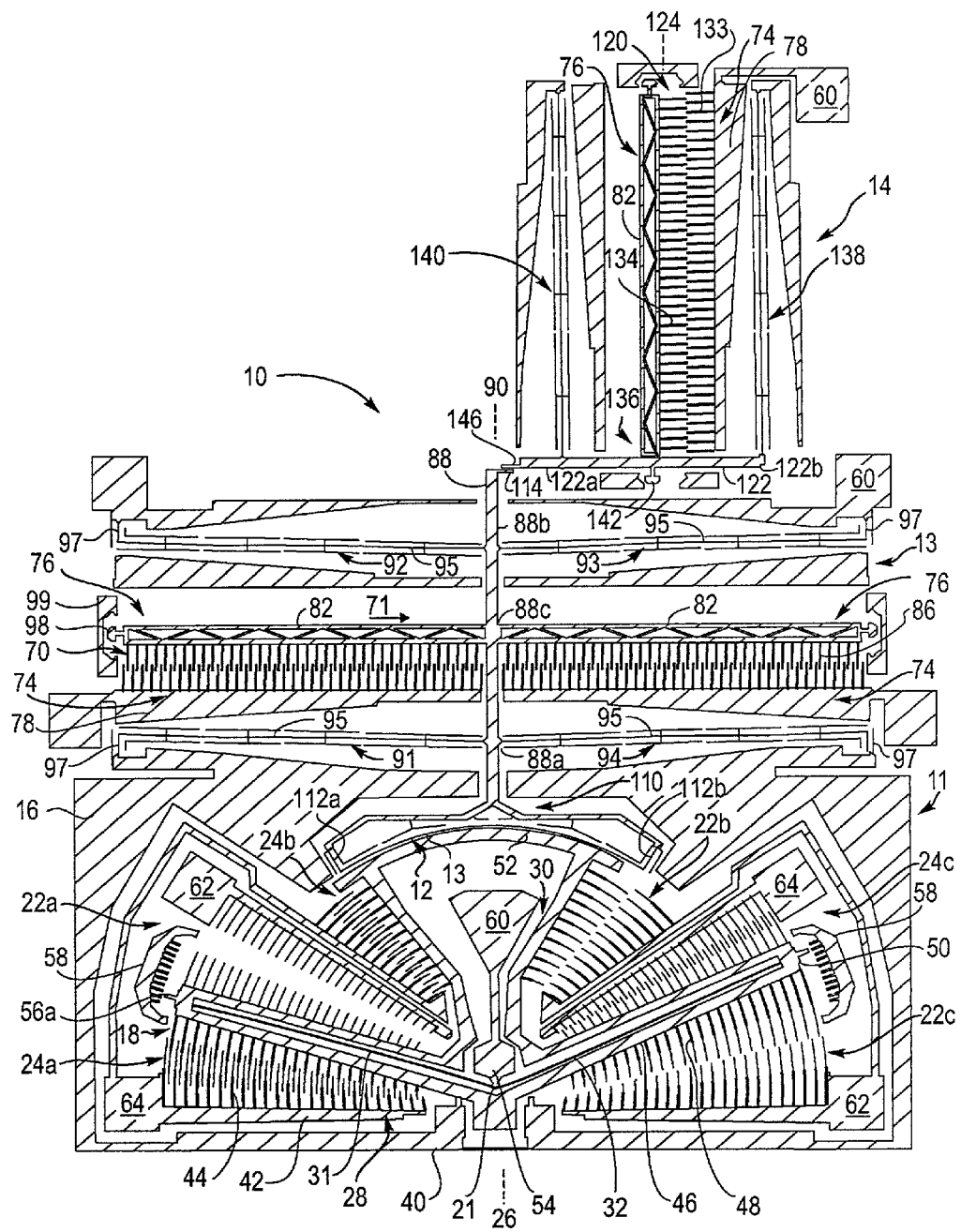
FIG. 3 is a top plan view of the micromechanical device of FIG. 1 in which the brake mechanism is engaged.

The micromechanical device of the present invention can be in any form and is suitable for use, for example, in a telecommunication system for performing functions of beam steering, collimation or coupling. In one embodiment of the invention, the micromechanical device 10 includes a microactuator 11 having a movable structure and a frictional brake 12. A brake microactuator 13 can be coupled to the brake for moving the brake into frictional engagement with the structure for immovably holding the structure. A lock microactuator 14 can be provided for locking the brake in frictional static engagement with the structure.

The microactuator 11 can be of any suitable type and is preferably an electromagnetic microactuator in which the movable portion of the microactuator is driven by electromagnetic forces. More preferably, the microactuator 11 is an electrostatic microactuator in which the movable portion of the microactuator is driven by electrostatic forces. Such electrostatic microactuator 11, in general, has similarities to the microactuators disclosed in U.S. Pat. No. 6329,737, U.S. Pat. No. 6,333,584, and U.S. patent application Ser. No. 09/727,794 filed Nov. 29, 2000, the entire content of each of which is incorporated herein by this reference. In this regard, microactuator 11 is formed on a planar substrate 16 and has a movable structure 18, which includes an element holder 20 that overlies substrate 16 (See FIGS. 1 and 3). At least one and as shown a plurality of first and second comb drive assemblies 22 and 24 are carried by substrate 16 for preferably rotating movable structure 18 in first and second opposite directions about an axis of rotation 21 extending perpendicular to planar substrate 16. The axis of rotation 21 is shown as a point in FIG. 1 and labeled by reference line 21. Each of the first and second comb drive assemblies 22 and 24 includes a first drive member or stationary comb member 28 mounted on substrate 16 and a second drive member or drive comb member 30 overlying the substrate 16. The movable structure 18 of rotary microactuator 11 includes second comb drives 30 and is supported or suspended above substrate 16 by first and second spaced-apart springs 31 and 32.

Substrate 16 is made from any suitable material such as silicon and is preferably formed from a silicon wafer. The substrate has a thickness ranging from 200 to 600 microns and preferably approximately 400 microns. Movable structure 18 and first and second springs 31 and 32 are formed atop the substrate 16 by a second or top layer 34 made from a wafer of any suitable material such as silicon (see FIG. 2). Top wafer 34 has a thickness ranging from 10 to 200 microns and preferably approximately 85 microns and is secured to substrate 16 by any suitable means. Top wafer 34 is preferably fusion bonded to substrate 16 by means of a silicon dioxide layer 36, which further serves as an insulator between the conductive top wafer 34 and the conductive substrate 16. Top wafer 34 may be lapped and polished to the desired thickness. Top wafer 34 may also be made by depositing any suitable material such as polysilicon or can be a wafer formed by the silicon-on-insulator (SOI) process. Movable structure 18 and first and second springs 31 and 32 are formed from top wafer 34 by any suitable means, and are preferably etched from the wafer 34 using deep reactive ion etching (DRIE) techniques or formed from the Lithographie Gavanometrie and Abformung (LIGA) process. Such DRIE techniques or LIGA process permit features with a high aspect ratio of about 20:1, that is they have a depth that is 20 times greater than the width of a feature so as to have a high degree of stiffness out the plane of substrate 16. The movable structure 18 and springs 31 and 32 are spaced above substrate 16 by an air gap 38 as shown in FIG. 2, that ranges from one to 30 microns and is preferably approximately 15 microns, so as to be electrically isolated from the substrate 15.

At least one and preferably a plurality of first comb drive assemblies 22 are included in rotary microactuator 11 and disposed about axis of rotation 21 for driving movable structure 18 in a clockwise direction about the axis of rotation 21. At least one and preferably a plurality of second comb drive assemblies 24 are included in microactuator 11 for driving movable structure 18 in a counterclockwise direction about the axis of rotation 21. Each of the first and second comb drive assemblies 22 and 24 extends substantially radially from axis of rotation 21 and the assemblies 22 and 24, in the aggregate, subtend and angle ranging from 45 to 360 degrees and preferably approximately 180 degrees to provide a semicircular or fan-like shape to the microactuator 11. More particularly, microactuator 11 has three first comb drive assemblies 22a, 22b, and 22c and three second comb drive assemblies 24a, 24b, and 24c. The rotary microactuator 11 has a base 40 extending along a diameter of the semicircle formed by the microactuator. A radial centerline 26 extends in the plane of substrate 16 perpendicular to base 40 and through axis of rotation 21. The first comb drive assemblies 22 are interspersed between the second comb drive assemblies 24, and the first comb drive assemblies 22 are symmetrically disposed relative to the second comb drive assemblies 24 about radial centerline 26. Element holder 20 is disposed at the center of microactuator 11 adjacent base 40.

First or stationary comb drive 28 of each of first and second comb drive assemblies 22 and 24 is mounted to substrate 16 by means of silicon dioxide layer 36 (See FIG. 2). The first or stationary comb drives 28 are thus immovably secured to the substrate 16 and part of the stationary structure of microactuator 11. Each of the first comb drives 28 has a radial-extending bar 42 provided with a first or inner radial portion and a second or outer radial portion as shown on FIGS. 1 and 3. A plurality of comb drive fingers or comb fingers 44 extend from one side of each bar 42 in longitudinally spaced-apart positions along the length of the bar at separation distances ranging from eight to 50 microns and preferably approximately 35 microns. First or stationary comb fingers 44 extend substantially perpendicularly from bar 42 and are each preferably arcuate in shape. In a preferred embodiment, piecewise linear segments are used to form the comb fingers 44 for approximating such an arcuate shape. Comb fingers 44 have a length ranging from 25 to 190 microns and increase substantially linearly in length from the inner portion to the outer portion of the bar 42. The comb fingers 44 can have a constant width along their length or vary in width along their length. For example, the comb fingers of first comb drive assembly 22a have a constant width along their length, while the comb fingers 44 of first comb drive assemblies 22b and 22c have a distal portion formed with a width less than the width of the proximal portion. Similarly, comb fingers 44 of the first or stationary comb drives 28 of second comb drive assemblies 24a and 24b have a distal portion which is wider than the proximal portion thereof, while comb fingers 44 of the first comb drive 28 of second comb drive assembly 24c are constant in width along the length thereof.

Second or movable comb drives 30 of each of first and second comb drive assemblies 22 and 24 are spaced above substrate 16 by an air gap 38 ranging from one to 30 microns so as to be electrically isolated from the substrate (See FIG. 2). The movable comb drives 30 each have a construction similar to the related first comb drive 28. In this regard, each of the movable comb drives 30 has a radially-extending bar 46 provided with a first or inner radial portion and a second or outer radial portion. A plurality of second comb drive fingers or comb fingers 48 extend from one side of each of the bars 46 in longitudinally spaced-apart positions along the length of the bar. Second or movable comb drive fingers 48 are substantially similar to first or stationary comb drive fingers 44. Some of the second comb drive fingers have a constant width along the length thereof, for example, the second comb drive fingers of first comb drive assembly 22a and second comb drive assembly 24c, while the remaining second comb drive fingers have a width at their proximal portion which is greater than the width at their distal portion. The second comb drive fingers 48 are offset relative to the first comb drive fingers 44 so that second comb drive fingers 48 can interdigitate with the first comb drive fingers 44 when each second comb drive 30 is moved closer to the respective first comb drive 28.

Bars 46 of second comb drive 30 are interconnected to form movable structure 18. In this regard, bar 46 of first comb drive assembly 22a and bar 46 of second comb drive assembly 24a are joined together at their outer radial end portions by an interconnecting member or link 50. Similarly, bar 46 of first comb drive assembly 22c and bar 46 of second comb drive assembly 24c are joined at their outer radial end portions by a link 50. The bars 46 of second comb drive assembly 24a and first comb drive assembly 22c are joined together at their inner radial end portions by element holder 20, which is preferably centered on radial centerline 26 adjacent axis of rotation 21. As such, the inner radial portions of such bars 46 are included within the means of microactuator 11 for coupling rotatable member or element holder 20 to second comb drives 30. Bars 46 of first comb drive assembly 22b and second comb drive assembly 24b are joined together by an interconnecting arcuate member 52 having an arcuate surface 53 at the respective outer radial end portions.

First and second comb drive assemblies 22 and 24 have a length ranging from 200 to 2000 microns and preferably approximately 800 microns.

Means including first and second spaced-apart springs 31 and 32 is included within rotary microactuator 11 for movably supporting structure 18 over substrate 16 and for providing radial stiffness to the second comb drives 30 and element holder 20. Springs 31 and 32 are symmetrically disposed about radial centerline 26 and can have a length which approximates the length of at least some of first and second comb drive assemblies 22 and 24. A bracket member or anchor 54 is provided for coupling first and second springs 31 and 32 to the substrate 16. The inner radial end portions of first and second springs 31 and 32 are preferably joined to anchor 54 at axis of rotation 21. Each of the springs 31 and 32 is preferably a single beam-like member having a first or inner radial end portion joined to anchor 54, so as to be coupled to substrate 16, and a second or outer radial end portion joined to a link 50, so as to be coupled to second comb drives 30 and the remainder of removable structure 18. First spring 31 extends radially outwardly from anchor 54 between movable bars 46 of first comb drive assembly 22a and second comb drives assembly 24a and second spring 32 extends radially outwardly from the anchor between movable bars 30 of first comb drive assembly 22c and second comb drive assembly 24c. The springs 31 and 32 each have a width ranging from one ten microns and preferably approximately four microns.

Second comb drives 30 of first and second comb drive assemblies 22 and 24 are each movable in a direction of travel about axis of rotation 21 between a first or rest position, as shown in FIG. 1, in which the comb fingers 44 and 48 are not substantially fully interdigitated and a second position, as shown in FIG. 3 with respect to second drive assembly 24a. Comb drive fingers 44 and 48 can be partially interdigitated, as shown with first comb drive assemblies 22b and 22c and second comb drive assemblies 24a and 24b, or fully disengaged and thus not interdigitated, as shown with first comb drive assembly 22a and second comb drive assembly 24b, when the second comb drives 30 are in their first position. When in their second position, movable comb drive fingers 48 of the second comb drives 30 extend between respective stationary comb drive fingers 44 of the first comb drives 28. Movable comb drive fingers 48 approach but preferably do not engage stationary bar 42 and similarly stationary comb drive fingers 44 approach but preferably do not engage movable bar 46.

Each of stationary and movable comb drive fingers 44 and 48 is optionally inclined relative to respective bars 42 and 46. That is each such comb finger is joined to its respective bar at an oblique angle, as disclosed in U.S. Pat. No. 6,333,584, as opposed to a right angle. The inclination angle at which each comb drive finger 44 and 46 is joined to its respective bar 42 and 46, measured from a line extending normal to the bar, can range from zero to five degrees and is preferably approximately three degrees. Each movable comb drive finger 48 is further optionally offset relative to the midpoint between the adjacent pair of stationary comb drive fingers 44 between which such movable comb drive finger interdigitates when the second comb drive 30 is electrostatically attracted to the first comb drive 28, also as disclosed in U.S. Pat. No. 6,333,584. When each movable comb drive finger 48 moves to its second position between the adjacent pair of stationary comb drive fingers 44, the movable comb drive finger becomes centered relative to the midpoint between the adjacent pair of stationary comb drive fingers 44.

First and second pointers 56 extend radially outwardly from respective links 50 for indicating the angular position of movable structure 18 about axis of rotation 21 on first and second scales 58 provided on substrate 16.

Electrical means is included for driving second or movable comb drives 30 between their first and second positions. Such electrical means can include a controller and voltage generator (not shown) electrically connected to a plurality of electrodes provided on substrate 16. Such electrodes include a ground or common electrode 60 electrically coupled to anchor 54 and thus second or movable comb drives 30, one or more first drive electrodes 62 coupled to the first or stationary comb drive assemblies 22, and one or more second drive electrodes 64 coupled to second comb drive assemblies 24. A metal layer (not shown) made from aluminum or any other suitable material is provided on the top surface of top wafer 34 for creating electrical bond pads and any leads relating thereto.

Controller and voltage generator are typically not an integral part of rotary microactuator 11. Means in the form of a closed loop servo control (not shown) such as in the type described in U.S. patent application Ser. No. 09/728,212 filed Nov. 29, 2000, the entire contents of which is incorporated herein by this reference, can be included for monitoring the position of movable comb drives 30 and thus, movable member 18.

As part of the movable structure 18, the arcuate member 52 can be rotated in opposite first and second directions of travel about axis of rotation 21. Suitable voltage potentials to first and second drive electrodes 62 and 64 can range from 20 to 250 volts and preferably range from 60 to 180 volts. Rotary actuator 11 is capable of +/− five degrees of angular rotation, that is a rotation of five degrees in both the clockwise and counterclockwise directions for an aggregate rotation of ten degrees, when such drive voltages are applied. Element holder 20 can be stopped and held at any location in such range of motion under the direction of the controller.

Brake 12 is provided to frictionally engage arcuate member 52 of the movable structure 18 at any point on the travel. Brake 12 is used to hold element holder 20 in a given location through frictional engagement between brake 12 and arcuate member 52.

Brake 12 is fabricated from the top wafer 34 in the manner discussed above. Brake 12 is movable relative to the substrate 16. A lateral distance between brake 12 and arcuate member 52 is provided, that is brake 12 is not in engagement with arcuate member 52 of movable structure 18 when rotary actuator 11 is fabricated. For instance, the lateral distance between the outer periphery of arcuate member 52 and brake 12 can be fabricated on the order of five to ten microns for etch depths on the order of 50–100 microns, and proportionately less for thinner devices.

Brake 12 preferably has a sidewall surface 13 substantially parallel to a sidewall surface 53 of the arcuate member 52. These sidewall surfaces are preferably microscopically rough to provide relatively high static friction on the contacting sidewalls surfaces of brake 12 and arcuate member 52. Preferably brake 12 has an arcuate surface for providing more conformal engagement with the arcuate member 52. Brake 12 preferably has a radius slightly larger than the radius of arcuate member 52 to reduce stiction between the brake and arcuate member when the brake is released.

Brake 12 is movable along a radial extending from the axis of rotation 21 and can travel a distance more than the lateral distance between arcuate member 52 and brake 12. For example, if the initial lateral distance between brake 12 and arcuate member 52 is set to 10 microns, brake 12 has to travel the initial 10 microns and additional distance to provide frictional forces to the arcuate member 52.

Brake actuator 13 is preferably used to move brake 12 into frictional engagement with arcuate member 52 of rotary actuator 11. Brake actuator 13 can be of any type such as an electromagnetic microactuator or any other electrically-driven microactuator including piezoelectric microactuators, but is preferably an electrostatic microactuator. The brake actuator 13 can be a linear microactuator of the type disclosed in U.S. Pat. No. 6,384,510. In this regard, brake actuator 13 is formed on a planar substrate, preferably the same substrate 16 from which rotary actuator 11 is fabricated, and has a movable structure 71 overlying the substrate 16. Brake actuator 13 is formed atop the substrate 16 by second or top layer 34 in the manner discussed above.

Brake actuator 13 includes at least two comb drive assemblies for moving brake 12 in a first direction. In the preferred embodiment as shown in FIG. 1, brake actuator 13 has two comb drive assemblies 70. Each of the comb drive assemblies 70 includes a first drive member 74 mounted on substrate 16 and a second drive member 76 overlying the substrate 16. The movable structure 71 of brake actuator 13 includes the second drive members 74 and is supported or suspended above substrate 16 by four symmetrically-disposed spaced-apart springs 91 through 94.

Each of the comb drive assemblies 70 is substantially similar in construction and has a length ranging from 200 to 2000 microns and preferably approximately 800 microns. A first drive member or stationary comb drive 74 is mounted on substrate 16 and a second drive member or movable comb drive 76 overlies the substrate 16. The first or stationary comb drive 74 is immovably secured to substrate 16 and is formed from a longitudinally-extending truss or bar 78 having first and second end portions. A plurality of first comb drive fingers or stationary comb fingers 80 extend from one side of each of the bar 78 in longitudinally spaced-apart positions along the length of the bar. The second or movable comb drive 76 is spaced above substrate 16 so as to be movable relative to the substrate and the stationary comb drive 74. The movable comb drive 76 has a construction similar to the stationary comb drive 74 and, more specifically, is formed with a longitudinally-extending truss or bar 82, each having first and second end portions 82a and 82b. A plurality of second comb drive fingers or movable comb fingers 86 extend from one side of bar 82 in longitudinally spaced-apart positions along the length of the bar.

The second or movable comb drive fingers 86 of the movable comb drive 76 face the first or stationary comb drive fingers 80 of the stationary comb drive 74. Stationary and movable comb drive fingers 80 and 86 are shown as being similar in construction and each have a length ranging from 15 to 150 microns and preferably approximately 60 microns.

Shuttle 88 is included in the brake actuator 13 and provided with first and second end portions 88a and 88b and a central portion 88c. The second end portion 82b of the movable bar 82 of each of the drive assemblies 70 is rigidly secured to the central portion 88c of shuttle 88. The movable bars 82 are symmetrically disposed relative to shuttle 88. Shuttle 88 extends substantially perpendicular to the movable bar 82 and thus substantially parallel to the longitudinal axis 90 of the brake actuator 13.

Shuttle 88 and movable comb drives 76 are part of a movable structure 71 of brake actuator 13. Such movable structure 71 is supported or suspended above substrate 16 by four spaced-apart symmetrically disposed springs 91 through 94. As such, springs 91 through 94 are included within the means of the brake actuator 13 for supporting or suspending the movable structure 71 over substrate 16. Springs 91 through 94 further provide linear stiffness along axis 90 to the movable comb drive 76 and movable structure 71. Each of the springs or suspensions 91 through 94 preferably has a length approximating the length of each of comb drive assemblies 70. Although springs 91 through 94 can be of any suitable construction, each of the springs is preferably formed from an elongate beam-like member or flexural beam 95 having a first end portion 95a coupled to substrate 16 and a second end portion 95b coupled to the respective first and second end portions of shuttle 88.

In particular, the second end portion of each of springs 91 and 94 is rigidly coupled to the first end portion 88a of shuttle 88. The second end portion of each of springs 92 and 93 is rigidly coupled to the second end portion 88b of shuttle 88. Each of the four springs 91 through 94 extends perpendicularly to shuttle 88. Springs 91 and 92 are spaced apart and substantially parallel to each other. Similarly springs 93 and 94 are spaced apart and substantially parallel to each other. Springs 91 and 94 are secured to a first common end portion of shuttle 88 and extend substantially along a line when in their rest position. Similarly springs 92 and 93 are secured to a second common end portion of shuttle 88 and extend substantially along a line when in their rest position.

Figure 5:
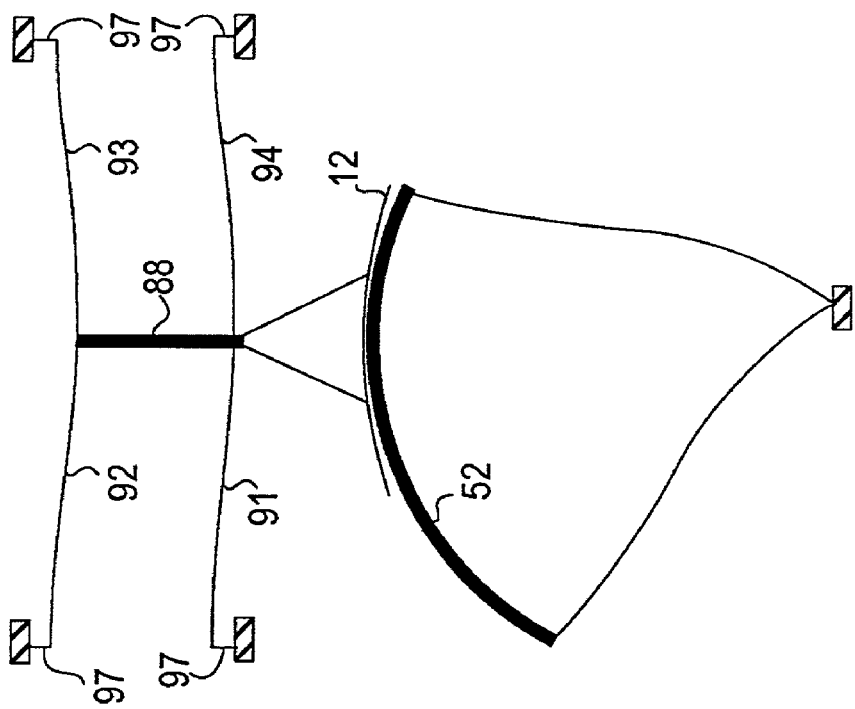
FIG. 5 is a partial schematic view of a portion of the micromechanical device of FIG. 1 in an engaged position.
Figure 4:
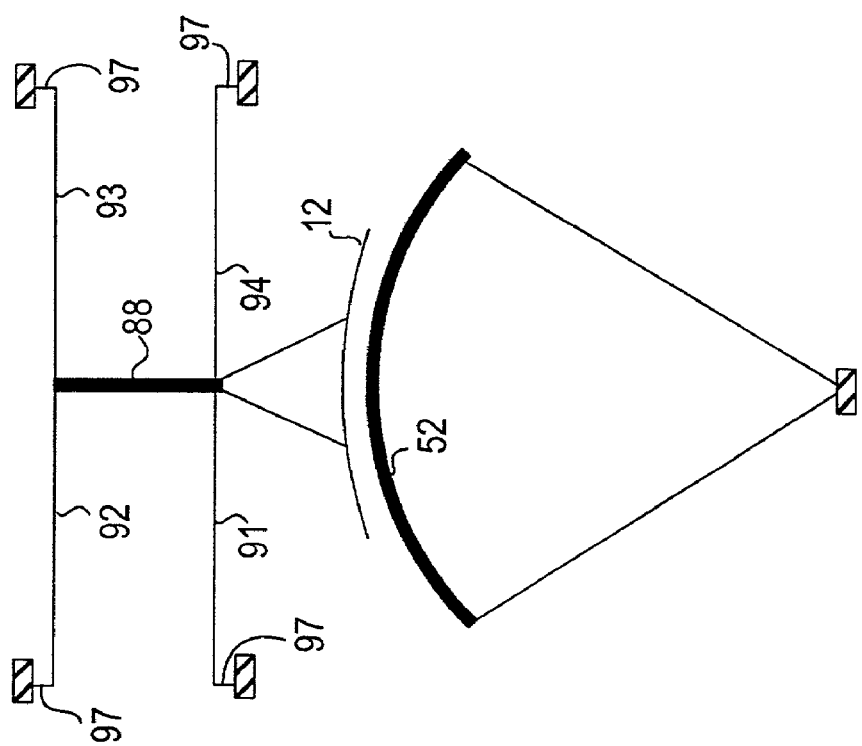
FIG. 4 is a partial schematic view of a portion of the micromechanical device of FIG. 1 in a disengaged position.

The first end portion 95a of each flexural beam 95 is provided with a first or flexural portion or leg 97. Flexural members 97 are secured to the substrate 16 and extend perpendicularly to the second or remaining portion of the flexural beam 95 when each respective spring is in its rest position. Flexural portion 97 are bendable when springs 91 through 94 deflect as shuttle 88 extends forwardly to engage brake 12 with the arcuate member 52 of rotary actuator 11. The length of leg 97 can be sized to provide a suitable balance of flexibility and stiffness for the movable structure 71. The four flexural beams, including their respective legs 97, form a symmetrical "crab leg" suspension of the brake actuator 13, as shown in FIGS. 4 and 5.

Each of the springs 91 through 94 is provided with first and second thin, elongate sacrificial beams 96, each of a type described in U.S. Pat. No. 5,998,906, to enhance even etching of the flexural beam 95 and thus formation of the desired rectangular cross section of the flexural beam. Sacrificial beams 96 extend parallel to the respective flexural beam 95 and are spaced apart on opposite sides of the beam. Movable structure 71 and springs 91 through 94 are spaced above substrate 16 by an air gap 38 shown in FIG. 2. The comb drive assemblies 70 are preferably disposed between the four springs, but can optionally be disposed outside of the springs 91 through 94 and be within the scope of the present invention.

Comb drive assemblies 70 operate similar to rotatable comb drive assemblies 22 and 24 disclosed above. In general, each second or movable comb drive 76 of comb drive assemblies 70 is movable relative to the respective first or stationary comb drive 74 from a first position shown in FIG. 1, in which comb fingers 80 and 86 are not substantially fully interdigitated, to a second position shown in FIG. 3 in which the comb fingers 80 and 86 are at least partially interdigitated. Movable comb fingers 86 are shown in FIG. 1 as being just disengaged, and thus not partially interdigitated, when in their first position. Nonetheless, it should be appreciated that the movable comb fingers can be partially interdigitated with the respective stationary comb fingers when in their first position and be within the scope of the present invention. As used herein, substantially fully interdigitated includes positions when the first and second comb drive fingers 80 and 86 are more interdigitated than when not substantially fully interdigitated, and particularly includes positions when the comb drive fingers 80 and 86 are fully interdigitated.

Stationary and movable comb fingers 80 and 86 are preferably of the type disclosed in U.S. Pat. No. 6,384,510. In general, each of the comb fingers extends along a line normal to the respective bar 78 or 82. In addition, when movable comb drives 76 are in their first or rest position shown in FIG. 1, each of movable comb fingers 86 is on a midpoint line extending between the adjacent pair of stationary comb fingers 80 into which such movable comb finger 86 interdigitates. When the movable comb drives 86 move to their second positions in which the movable comb fingers 86 interdigitate with the stationary comb fingers 80 shown in FIG. 3, each movable comb finger 86 is still centered on such midpoint line.

Movement of second comb drives 76 of the first and second comb drive assemblies 70 to their respective second positions causes shuttle 88 to move substantially linearly relative to substrate 16. Shuttle 88 of brake actuator 13 moves forwardly and rearwardly in linear directions that are substantially parallel to the longitudinal axis 90 of the brake actuator 13.

Similar to rotary actuator 11, electrical means (not shown) is included for driving movable comb drives 76 of brake actuator 13 between first and second positions. In one embodiment, actuator 11 and 13 are operated by the same controller. Means in the form of a closed looped servo control (not shown) can be included for monitoring the position of movable comb drives 76 and thus movable structure 71.

Bracket 110 is provided to couple brake actuator 13 to brake 12. Bracket 110 is coupled to the first end portion 88a of shuttle 88 and movable parallel to the axis 90 of brake actuator 13. Bracket 110 is fabricated from top wafer 34 in the manner described above. Bracket 110 can be fabricated in any suitable shape and is preferably symmetric relative to shuttle 88. In one preferred embodiment, bracket 110 includes a first portion 110a that is V-shaped and is coupled to the first end portion 88a of shuttle 88. A second portion 110b extends perpendicularly to shuttle 88 and is coupled to the first portion 110a. A third portion 110c is coupled to the second portion 110b. While a specific shape of bracket is shown and described herein, the present invention is not so limited. The bracket 110 can be in any shape suitable to couple with brake 12, which preferably has an arcuate surface.

Flexural members 112 are provided to connect brake 12 to bracket member 110. The flexural members 112 are fabricated from the top wafer 34 by any suitable means as described above. Flexural members 112 are bendable for taking up forces when brake 12 is brought into contact with arcuate member 52 of rotary actuator 11. The flexural members 112 can also be used to adjust the lateral stiffness of the movable structure 71 of brake actuator 13 to allow a certain amount of adjustment of the position of the rotary actuator 11 after brake 12 has been applied.

A pin member 114 is provided at second end portion 88b of shuttle 88 for coupling the linear brake actuator 13 to a locking actuator 14.

Optional lock actuator 14 is preferably used to lock both brake actuator 13 and rotary actuator 11 when brake 12 is engaged with rotary actuator 11 at a given location. Lock actuator 14 is preferably disposed adjacent brake actuator 13. Lock actuator 14 includes at least one comb drive assembly 120 for moving a shuttle 122 between extended and retracted positions in a direction perpendicular to a longitudinal axis 124 of the actuator 14. Comb drive assembly 120 of lock actuator 14 is substantially similar in construction to the drive assemblies 70 of brake actuator 13 and like reference numbers have been used to describes like components of actuators 13 and 14. The second end portion the movable bar 82 is rigidly secured to a central portion of shuttle 122.

Shuttle 122 and movable comb drive 76 are part of a movable structure 136 of lock actuator 14. Such movable structure 136 is supported or suspended above substrate 16 by first and second spaced-apart springs 138 and 140. Each of springs or suspensions 138 and 140 preferably has a length approximating the length of the comb drive assembly 120 and is provided with a first end portion coupled to substrate 16 and a second end portion coupled to one of the end portions of shuttle 122. Springs 138 and 140 are disposed substantially parallel to each other and perpendicular to shuttle 122 when in their rest position.

First drive member or stationary comb drive 74 is mounted on substrate 16 and is formed from a longitudinal-extending truss or bar 78. Second drive member or movable comb drive 76 overlies the substrate 16 and is formed from a longitudinal-extending truss or bar 82. A plurality of first comb drive fingers or stationary comb fingers 133 extend from one side of bar 78 in longitudinally spaced-apart positions along the length of the bar. A plurality of second comb drive fingers or movable comb fingers 134 extend from one side of bar 82 in longitudinally spaced-apart positions along the length of the bar. The second or movable comb drive 76 of comb drive assembly 120 is movable relative to the first or stationary comb drive 74 from a first position shown in FIG. 1, in which comb fingers 133 and 134 are not substantially fully interdigitated, to a second position (not shown), in which the comb fingers 133 and 134 are substantially fully interdigitated. Bumpers 142 are provided on the first and second end portions of movable bar 82 for engaging respective forward and rearward stops 144 formed on substrate 16 to limit the movement of shuttle 122 and the remainder of movable structure 136.

Stationary and movable comb fingers 133 and 134 are preferably of the type disclosed in U.S. Pat. No. 6,384,510, as such, are inclined and offset. In general, each of the comb fingers is slightly inclined from a line extending normal to the respective bar 78 or 82. In addition, when movable comb drives 76 are in their first or rest position shown in FIG. 1, each of movable comb fingers 134 is offset relative to a midpoint line extending between the adjacent pair of stationary comb fingers 133 into which such movable comb finger 134 interdigitates. When the movable comb drives 134 move to their second positions in which the movable comb fingers 134 interdigitate with the stationary comb fingers 133, each movable comb finger 134 becomes centered on such midpoint line. The inclination and offset of stationary and movable comb fingers 133 and 134 accommodate the foreshortening and deflection of springs 138 and 140 and the resulting movement of movable comb drives 76 perpendicular to the longitudinal axis 124 as movable structure 136 moves from its first position, in which springs 138 and 140 are in a straightened position as shown in FIG. 1, to its second position, in which springs 138 and 140 are bent or deflected (not shown).

Shuttle 122 of lock actuator 14 is provided with a pin member 146 at the first end portion 122a.

Electrical means (not shown) is included for driving movable comb drives 82 of lock actuator 14 between first and second positions. Means in the form of a closed looped servo control (not shown) can be included for monitoring the position of movable comb drives 82 and thus movable structure 136.

In operation and use, rotary actuator 11 is activated so that electrostatic forces between the comb members 44 and 48 cause the movable structure 18 to rotate about axis of rotation 21 for example through a +/− five degree angular range. Rotary actuator 11 can be stopped at any location in such range of rotation under the direction of the controller.

When it is desired to hold the rotary actuator 11 at the given location, lock actuator 14 is activated so that electrostatic forces between the comb drive members 74 and 76 cause shuttle 122 of lock actuator to retract and pull pin member 146 so that pin member 114 of shuttle 88 of brake actuator 13 can pass as shuttle 122 of lock actuator 14 retracts.

Brake actuator 13 is then activated so that shuttle 88 of brake actuator 13 extends forwardly by the electrostatic forces between the comb drive members 74 and 76. As shown in FIG. 5, brake 12 is engaged with the arcuate member 52 of rotary actuator 11 by frictional forces to hold the movable structure 18 at the given location. The arcuate surface of brake 12 provides a conformal engagement with the arcuate member 52. The symmetrical "crab leg" suspension of brake actuator 13 allows substantially linear movement of shuttle 88 along the radial central line. The symmetrical "crab leg" suspension also provides a symmetric braking force with respect to the center of rotation of rotary actuator 11, thus reducing additional rotation of rotary actuator 11 caused by application of the braking force. The bendable flexural end portion 97 of the "crab leg" suspension allow significant greater movement of shuttle 88, and thus greater forces applied to the movable structure 18 of the rotary actuator 11.

Lock actuator 14 is then deactivated so that springs 138 and 140 urge shuttle 122 to its normal position in which pin member 146 of lock actuator 14 engages the top end of pin member 114 of brake actuator 13 so as to preclude shuttle 88 and thus brake 12 from retracting shown in FIG. 3. Optionally rotary actuator 11 can be further rotated by applying additional forces for fine adjustment as described below. Lock actuator 14 can increase resistance to vibration and hold rotary actuator 11 at any given location if power is lost to both brake actuator 13 and rotary actuator 11.

When it is desired to release brake 12 from arcuate member 52 of rotary actuator 11 from a lock position shown in FIG. 3, brake actuator 13 is reactivated so that shuttle 88 of brake actuator 13 extends slightly forwardly. Lock actuator 14 is reactivated so that shuttle 122 and thus pin member 146 of shuttle 122 of lock actuator 14 is retracted from the top end of pin member 114 of brake actuator 13. Actuator 13 is then deactivated and springs 91 through 94 urge shuttle 88 to normal position and thus release brake 12 from arcuate member 52 of rotary actuator 11.

One advantage of the micromechanic device having braking mechanism of the invention is that the actuator can be moved and held at any given location within the range of travel. Optional locking mechanism can lock the actuator in any given location even if power to the actuator is removed. This is advantageous for many applications where translation or rotation of an element to a particular location in continuous manner is required, and where it is desirable to hold or lock an actuator in a plurality of locations that are not necessarily known nor can be predicted when the actuator is designed or made. Further, the micromechanical device of the invention does not rely on notches, pins, or other interlocking features to define adjustment positions, but advantageously use a braking mechanism to hold adjustment positions arbitrarily along the moving range of the device.

Another advantage of the micromechanic device of the invention is that the device allows large translations or rotations to generally lock the mechanism at a coarse adjustment location, and then slightly change the position for fine adjustment. This is particularly advantageous in the field of micro-optics, where relatively large translations or rotations are required to perform the functions of beam steering, collimation, or coupling. It is often necessary to perform a coarse adjustment to generally locate or steer a component or beam and then perform a fine adjustment to optimize the performance of an optical system. As described above, additional rotary actuator applied forces tend to bend the flexural members 112. For instance, with the dimensions as described above, the flexural members 112 tend to bend about one micron when full rotary actuator torque is applied. Thus the position of rotary actuator 11 can be adjusted by about +/−1% of full scale after brake 12 is applied. This ratio can be controlled primarily by controlling the geometry of the flexural members 112. An 1% adjustment range is suitable for a variety of precision optical adjustments for beam steering, and coupling etc.

As can be seen from the foregoing, a microactuator having braking mechanism has been provided. The microactuator is provided with a frictional brake that is movable into frictional engagement with the movable structure of the microactuator for immovably holding the structure.

The foregoing description of specific embodiments and examples of the invention have been presented for the purpose of illustration and description, and although the invention has been illustrated by certain of the preceding examples, it is not to be construed as being limited thereby. For instance, the braking mechanism can also be provided for a linear microactuator to hold the linear microactuator at any give location. It is intended that the scope of the invention encompass the generic area as herein disclosed, and by the claims appended hereto and their equivalents.

What is claimed is:

1. A micromechanical device comprising a substrate, a structure overlying the substrate and movable relative to the substrate, a frictional brake overlying the substrate and an electrostatic brake microactuator coupled to the brake for moving the brake into frictional engagement with the structure for holding the structure relative to the substrate, the structure having an arcuate surface with a radius and the brake having an arcuate surface with a radius that is larger than the radius of the arcuate surface of the structure.

2. The micromechanical device of claim 1 wherein the structure is part of a microactuator.

3. The micromechanical device of claim 2 wherein the microactuator is an electromechanical microactuator.

4. The micromechanical device of claim 3 wherein the electromechanical microactuator is an electrostatic microactuator.

5. The micromechanical device of claim 2 wherein the microactuator is a rotatable microactuator and the structure is rotatable about an axis of rotation between first and second positions.

6. The micromechanical device of claim 5 wherein the structure has an arcuate surface and wherein the brake has an arcuate surface for frictionally engaging the arcuate surface of the structure.

7. The micromechanical device of claim 1 wherein the brake is movable a distance greater than a distance between the arcuate surfaces of the structure and brake.

8. The micromechanical device of claim 5 wherein the brake is movable along a radial extending from the axis of rotation.

9. The micromechanical device of claim 1 wherein said brake microactuator is a linear microactuator.

10. The micromechanical device of claim 9 wherein said linear microactuator comprises first and second drive assemblies, each of the first and second drive assemblies having a first drive member mounted to the substrate and a second drive member overlying and movable relative to the substrate, a shuttle perpendicular and coupled to the second drive members and first and second spring members, each of the first and second spring members having a first end portion coupled to the substrate and a second end portion coupled to the shuttle for suspending the shuttle and the second drive member above the substrate, wherein the first and second two drive assemblies share the common shuttle and are symmetrically disposed with respect to the shuttle.

11. The micromechanical device of claim 10 wherein the first end portion of each of the first and second spring members includes a flexural member having first and second portions, the first portion being inclined relative to the second portion and being coupled to the substrate.

12. The micromechanical device of claim 11 wherein the first portion is inclined at a right angle to the second portion.

13. The micromechanical device of claim 10 further comprising a bracket coupled to a first end of the shuttle and being symmetrically disposed with respect to the shuttle.

14. The micromechanical device of claim 13 further comprising first and second flexural members connecting the brake to the bracket.

15. The micromechanical device of claim 1 further comprising a locking mechanism for locking the brake in frictional static engagement with the structure.

16. The micromechanical device of claim 15 wherein the brake microactuator includes a drive member movable between a first position in which the brake is not in frictional static engagement with the structure and a second position in which the brake is in frictional static engagement with the structure and wherein the locking mechanism includes a pin for engaging the drive member so as to hold the drive member in the second position.

17. The micromechanical device of claim 16 wherein the locking mechanism includes a pin microactuator coupled to the pin for moving the pin between a first position in which the pin does not engage the drive member and a second position in which the pin engages the drive member.

18. The micromechanical device of claim 1 wherein the structure is movable in a linear direction between first and second positions and the brake is movable in a direction perpendicular to the linear direction.

19. The micromechanical device of claim 1 wherein the structure is part of an electrostatic microactuator.

20. The micromechanical device of claim 1 further comprising a brake microactuator coupled to the brake for moving the brake into frictional engagement with the structure.

21. A micromechanical device comprising a substrate, a structure overlying the substrate and movable relative to the substrate and a braking mechanism overlying the substrate and movable into frictional engagement with the structure for holding the structure in a position relative to the substrate, the braking mechanism including a bracket and a brake and first and second spaced-apart flexural members for connecting the brake to the bracket whereby the first and second flexural members permit adjustment of the position of the structure after the braking mechanism has engaged the structure.

22. The micromechanical device of claim 21 further comprising a brake microactuator coupled to the braking mechanism for moving the braking mechanism into frictional engagement with the structure.

23. The micromechanical device of claim 22 wherein the brake microactuator is an electrostatic microactuator.

24. A micromechanical device comprising a substrate, a structure overlying the substrate and movable to a plurality of operable positions relative to the substrate and a frictional brake overlying the substrate, the frictional brake being movable from a rest position in which the frictional brake is not in frictional engagement with the structure to an actuated position in which the frictional brake frictionally engages the structure for selectively holding the structure in any one of the plurality of operable positions.

25. The micromechanical device of claim 24 wherein the structure is part of a microactuator.

26. The micromechanical device of claim 25 wherein the microactuator is an electrostatic microactuator.

27. The micromechanical device of claim 25 wherein the microactuator is a rotatable microactuator.

28. The micromechanical device of claim 24 wherein the structure is rotatable about an axis of rotation to a plurality of operable positions relative to the substrate.

29. The micromechanical device of claim 28 wherein the structure has an arcuate surface and wherein the brake has an arcuate surface for frictionally engaging the arcuate surface of the structure.

30. The micromechanical device of claim 29 wherein the brake is movable a distance greater than a distance between the arcuate surfaces of the structure and brake.

31. The micromechanical device of claim 28 wherein the brake is movable along a radial extending from the axis of rotation.

32. The micromechanical device of claim 24 further comprising a brake microactuator coupled to the brake for moving the brake into frictional engagement with the structure.

33. A micromechanical device comprising a substrate, a structure overlying the substrate and movable relative to the substrate, the structure having a surface provided with a shape, a frictional brake overlying the substrate and a microactuator coupled to the brake for moving the brake into frictional engagement with the structure for holding the structure relative to the substrate, the brake including a flexible member that at least partially conforms to the shape of the surface when engaging the structure whereby the flexible member inhibits stiction between the brake and the structure when the brake is disengaged from the structure.

34. The micromechanical device of claim 33 further comprising a brake microactuator coupled to the brake for moving the brake into frictional engagement with the structure.

35. The micromechanical device of claim 33 wherein the structure is part of a microactuator.

36. The micromechanical device of claim 33 wherein the structure is rotatable about an axis of rotation relative to the substrate.

37. The micromechanical device of claim 36 wherein the surface of the structure is an arcuate surface.

* * * * *